United States Patent [19]

Moore, III

[11] 3,935,565
[45] Jan. 27, 1976

[54] SIGNAL GENERATOR COMPRISING AN ADDRESSABLE MEMORY

[75] Inventor: Harry W. Moore, III, Dryden, N.Y.

[73] Assignee: Sperry Rand Corporation, New York, N.Y.

[22] Filed: Aug. 19, 1974

[21] Appl. No.: 498,789

[52] U.S. Cl. .................. 340/173 R; 340/173 SP
[51] Int. Cl.² ........................................ G11C 13/00
[58] Field of Search ............................ 340/173 R

[56] References Cited
UNITED STATES PATENTS 3,772,658  11/1973  Sarlo .......................... 340/173 R Primary Examiner—Terrell W. Fears
Attorney, Agent, or Firm—Kenneth T. Grace; Thomas J. Nikolai; Marshall M. Truex

[57] ABSTRACT

A circuit for and a method of utilizing an addressable memory as the generator of timing pulse signals is disclosed. The memory has $n$ separate input terminals for receiving the n-bits of an n-bit address word to address one of the $2^n$ addressable registers therein. Each register stores an n-bit data word, and, when addressed, couples the $n$ bits of the addressed data word to a separate associated one of $n$ separate output terminals. N separate feedback conductors couple each separate one of the $n$ output terminals back to only a separate associated one of the $n$ input terminals. The memory, when enabled, reads out the data word stored in a first addressed one of its registers for continuously cycling the memory through its $2^n$ registers by using the read out data word as the address word to address the next addressed register at the next memory cycle. N separate output signal conductors are coupled to each separate one of the $n$ separate output terminals for providing, on each separate one of the n output signal conductors, n timing pulse signals.

5 Claims, 9 Drawing Figures

OSC PROM 10

MT PROM 26

SEQ A PROM 28

SIGNAL GENERATOR COMPRISING AN ADDRESSABLE MEMORY

BACKGROUND OF THE INVENTION

Generators of clocking signals for the timing of digital functions in a data processing system are usually delay lines having the various timing pulses derived by taps along its length. Such delay lines are costly, relatively large in volume and relatively inefficient in operation. The advent of inexpensive medium scale integrated (MSI) packages has enabled the circuit designer to implement many prior art hybrid or discrete circuits using the advantages of the newest MSI packages. See the W. W. Davis patent application Ser. No. 388,869, filed Aug. 16, 1973, now U.S. Pat. No. 3,846,705. The present invention is directed toward such a novel use of a commercially available MSI package.

SUMMARY OF THE INVENTION

The present invention is directed toward a method of intercoupling one or more commercially available MSI circuit packages to form a generator of periodic pulses which pulses may be utilized for various digital timing functions. The MSI circuit is preferably a (PROM) having an n-bit input address word and an m-bit output data word. Each of the n lowest ordered bits of the m-bit output data words that are stored in the addresses of the PROM is coupled back to a respectively associated one of the n input bits such that when the PROM is enabled the data word at the output is utilized as an address word at the input, to address another data word. Each output bit may be used as a phase or enable pulse while the repetition rate or frequency that is normally determined by the PROM's internal circuitry may be adjusted by adding delay means external to the MSI package.

DESCRIPTION OF THE PREFERRED EMBODIMENTS

Figure 1:
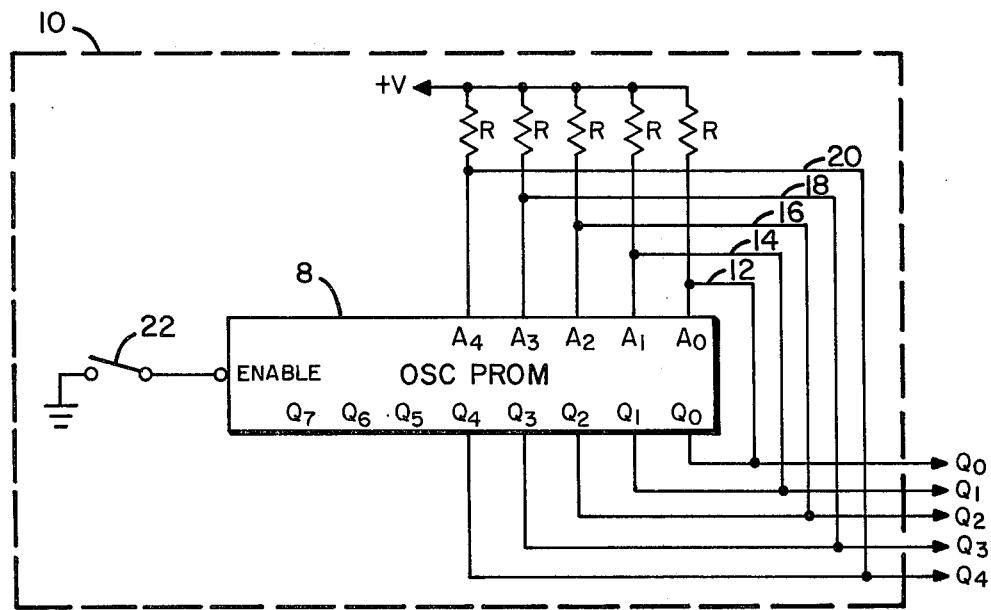
FIG. 1 is a circuit schematic of an OSC PROM illustrating the manner in which the input (address) terminals and the output (data) terminals of an MSI PROM are intercoupled according to the present invention.
Figure 2:
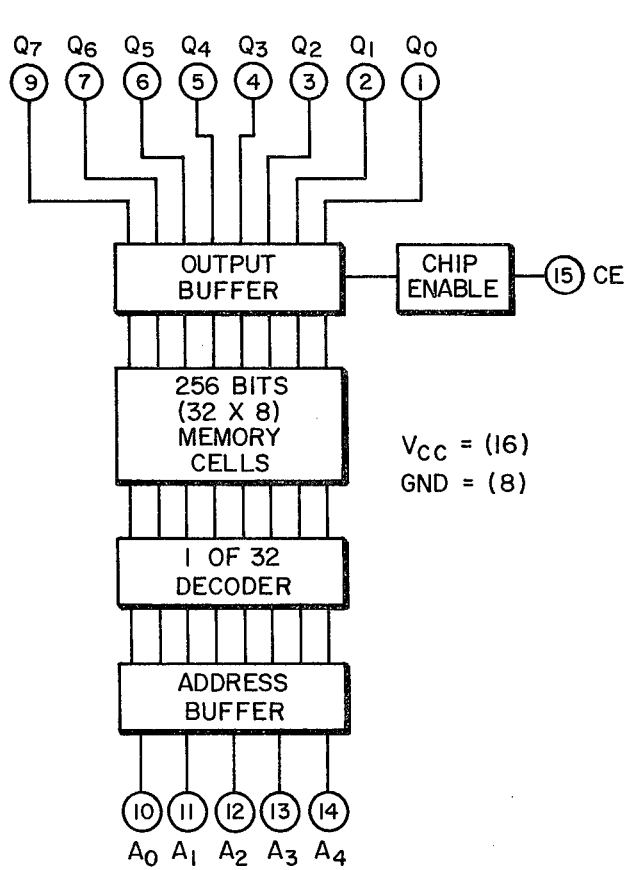
FIG. 2 is a block diagram of an illustrative MSI PROM (Intersil PROM IM 5600) that is incorporated in the illustrative circuit of FIG. 1.

With particular reference to FIG. 1 there is presented a schematic diagram illustrating the manner in which an MSI PROM 8 is intercoupled to form the OSC PROM 10 of the preferred embodiment of the present invention. As stated hereinabove PROM 8 is a commercially available integrated circuit (IC) and in the preferred embodiment is an Intersil PROM IM 5600, a block diagram of which is illustrated in FIG. 2. PROM 8 is a semiconductor memory having the five input terminals $A_0, A_1, \ldots A_4$ that receive the 5-bit address word, providing on the output terminals $Q_0, Q_1, \ldots Q_7$ the eight-bit data word, 32 of which are stored in PROM 8. Each like-ordered output terminal, e.g., output terminal $Q_0$ is directly coupled back to its like-ordered input terminal $A_0$, by conductors 12, 14, 16, 18, 20 such that the bits of the data word that are read out of PROM 8 during one memory cycle function as the bits of the address word for the next memory cycle while the memory cycle time or frequency is determined by the delay of the internal electronics of PROM 8.

Figure 3:
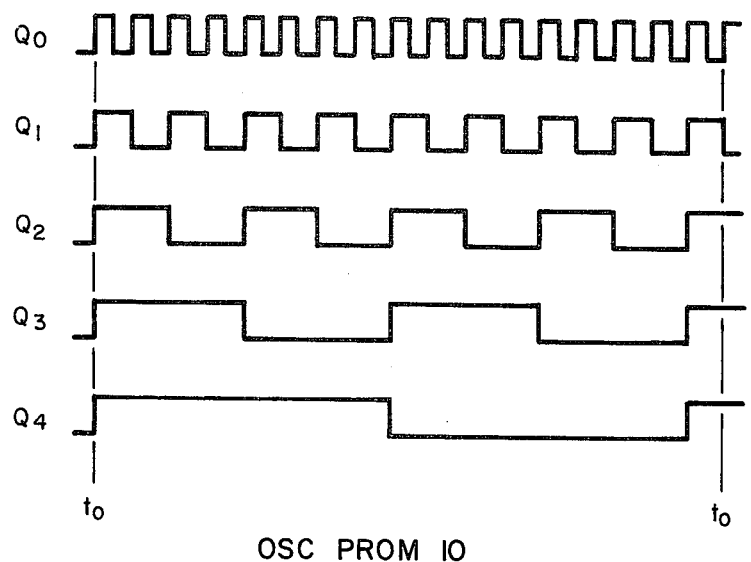
FIG. 3 is a timing diagram of the circuit of FIG. 1.

Initially, to set up PROM 8 as a continuously running oscillator the octal addresses 0 through 37 thereof are loaded with the corresponding octal data words 1 through 37, 0 such as illustrated in Table A. Then, with the input terminals $A_0$–$A_4$ coupled to the respective voltage source +V through their associated resistors R, when switch 22 is closed the signals illustrated in the timing diagram of FIG. 3 are emitted at their associated terminals $Q_0$–$Q_4$. It is to be noted that with an n-bit address word, e.g., 5 bits in the illustrated embodiment, only a like number, e.g., 5 bits of output terminals $Q_0$–$Q_4$ are utilized in the present invention. In this embodiment only the lower ordered bits of the stored data words are utilized with the higher ordered bits $Q_5$, $Q_6$, $Q_7$ not utilized or ignored. Reference to FIG. 3 indicates that the output wave forms $Q_0$–$Q_4$ are successively half the frequency

TABLE A

| | | | | O S C PROM 10 | | | | | |
|---|---|---|---|---|---|---|---|---|---|
| $A_4$ | $A_3$ | $A_2$ | $A_1$ | $A_0$ | $Q_4$ | $Q_3$ | $Q_2$ | $Q_1$ | $Q_0$ |
| 0 | 0 | 0 | 0 | 0 | 0 | 0 | 0 | 0 | 1 |
| 0 | 0 | 0 | 0 | 1 | 0 | 0 | 0 | 1 | 0 |
| 0 | 0 | 0 | 1 | 0 | 0 | 0 | 0 | 1 | 1 |
| 0 | 0 | 0 | 1 | 1 | 0 | 0 | 1 | 0 | 0 |
| 0 | 0 | 1 | 0 | 0 | 0 | 0 | 1 | 0 | 1 |
| 0 | 0 | 1 | 0 | 1 | 0 | 0 | 1 | 1 | 0 |
| 0 | 0 | 1 | 1 | 0 | 0 | 0 | 1 | 1 | 1 |
| 0 | 0 | 1 | 1 | 1 | 0 | 1 | 0 | 0 | 0 |
| 0 | 1 | 0 | 0 | 0 | 0 | 1 | 0 | 0 | 1 |
| 0 | 1 | 0 | 0 | 1 | 0 | 1 | 0 | 1 | 0 |
| 0 | 1 | 0 | 1 | 0 | 0 | 1 | 0 | 1 | 1 |
| 0 | 1 | 0 | 1 | 1 | 0 | 1 | 1 | 0 | 0 |
| 0 | 1 | 1 | 0 | 0 | 0 | 1 | 1 | 0 | 1 |
| 0 | 1 | 1 | 0 | 1 | 0 | 1 | 1 | 1 | 0 |
| 0 | 1 | 1 | 1 | 0 | 0 | 1 | 1 | 1 | 1 |
| 0 | 1 | 1 | 1 | 1 | 1 | 0 | 0 | 0 | 0 |
| — | — | — | — | — | — | — | — | — | — |
| — | — | — | — | — | — | — | — | — | — |
| 1 | 1 | 1 | 0 | 1 | 1 | 1 | 1 | 1 | 0 |
| 1 | 1 | 1 | 1 | 0 | 1 | 1 | 1 | 1 | 1 |
| 1 | 1 | 1 | 1 | 1 | 0 | 0 | 0 | 0 | 0 | of the output signal at the next previously lower ordered output terminal, all output signals being multiples of the basic frequency of the wave form $Q_0$ that is determined by the delay of the internal electronics of PROM 8.

Figure 4:
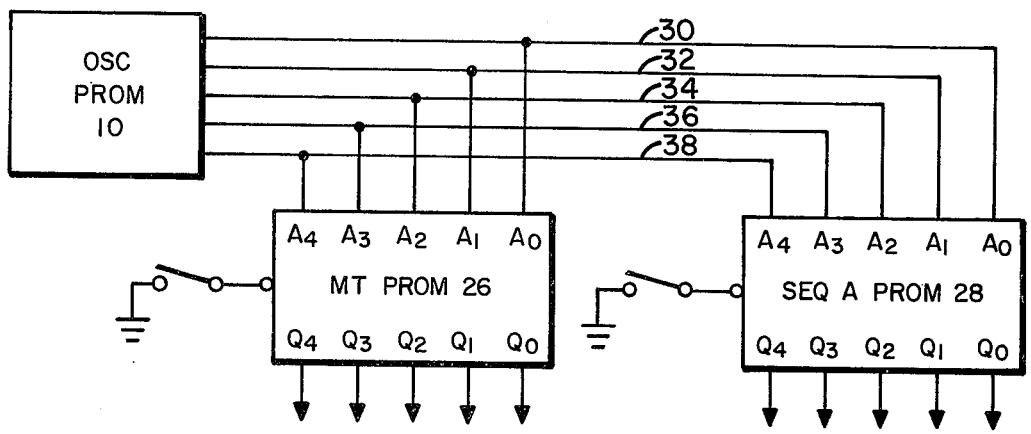
FIG. 4 is a circuit schematic illustrating the manner in which the circuit of FIG. 1 may be utilized with additional MSI packages to function as a full clock and sequence timing generator for a data processing system.
Figure 5:
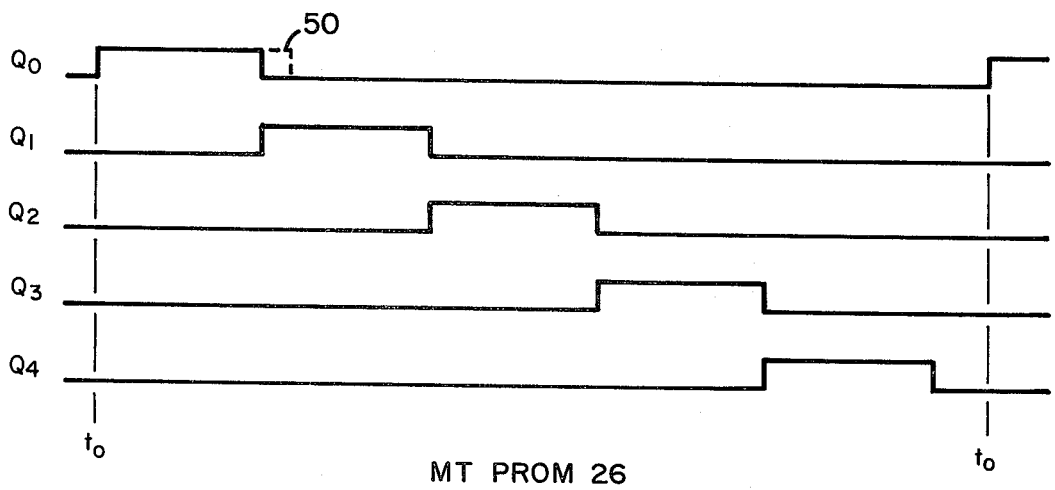
FIG. 5 is a timing diagram of the MT PROM of FIG. 4.
Figure 6:
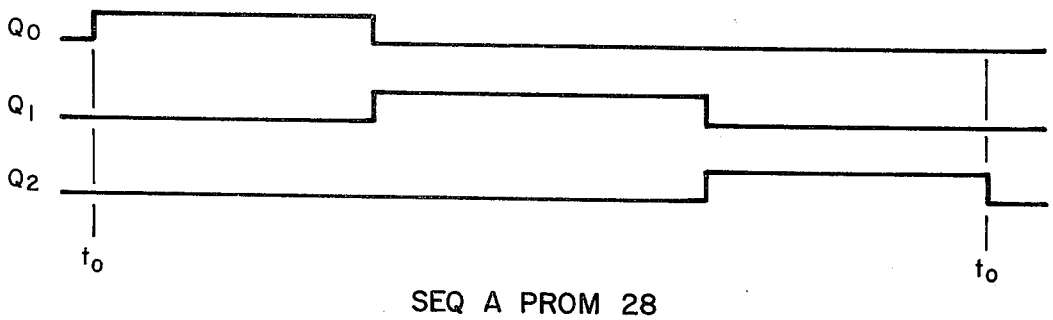
FIG. 6 is a timing diagram of the SEQ A PROM of FIG. 4.

With particular reference to FIG. 4 there is presented a schematic diagram illustrating the manner in which the OSC PROM 10 of FIG. 1 may be utilized with additional MSI packages 26, 28 to function as a full clock and sequence timing generator for a data processing system. In this system, OSC PROM 10 of FIG. 1 is coupled to Main Timing (MT) PROM 26 and Sequence A (SEQ A) PROM 28 at their input terminals $A_0$–$A_4$, in parallel, by conductors 30, 32, 34, 36, 38. MT PROM 26 and SEQ A PROM 28 may, for the purposes of the present discussion, be similar to PROM 8 of FIG. 1 each comprising a capacity of 32 data words each of eight bits in length. When driven at their input terminals $A_0$–$A_4$, with MT PROM 26 having the data words loaded therein as illustrated in Table B and SEQ A PROM 28 having the data words loaded therein as illustrated in Table C, MT PROM 26 provides at its output terminals $Q_0$–$Q_4$ the wave forms as illustrated in the timing diagram of FIG. 5 and SEQ A PROM 28 provides at its output terminals $Q_0$–$Q_2$ the wave forms as illustrated in the timing diagram of FIG. 6.

In the configuration of FIG. 4 it is apparent that by the loading of a different series of data words in MT PROM 26 and SEQ A PROM 28 as compared to those data words illustrated in Table B and Table C, any particular set of associated wave forms may be obtained, the only requirement being that a 1 be positioned in the particular data word concerned to provide the relatively high level output as compared to a 0 providing the relatively low level output. It is to be noted that

TABLE B

| | | | | | MT PROM 26 | | | | | |
|---|---|---|---|---|---|---|---|---|---|---|
| $A_4$ | $A_3$ | $A_2$ | $A_1$ | $A_0$ | $Q_4$ | $Q_3$ | $Q_2$ | $Q_1$ | $Q_0$ | |
| 0 | 0 | 0 | 0 | 0 | 0 | 0 | 0 | 0 | 1 | |
| 0 | 0 | 0 | 0 | 1 | 0 | 0 | 0 | 0 | 1 | |
| 0 | 0 | 0 | 1 | 0 | 0 | 0 | 0 | 0 | 1 | |
| 0 | 0 | 0 | 1 | 1 | 0 | 0 | 0 | 0 | 1 | T1 |
| 0 | 0 | 1 | 0 | 0 | 0 | 0 | 0 | 0 | 1 | |
| 0 | 0 | 1 | 0 | 1 | 0 | 0 | 0 | 0 | 1 | |
| 0 | 0 | 1 | 1 | 0 | 0 | 0 | 0 | 1 | 0 | |
| 0 | 0 | 1 | 1 | 1 | 0 | 0 | 0 | 1 | 0 | |
| 0 | 1 | 0 | 0 | 0 | 0 | 0 | 0 | 1 | 0 | T2 |
| 0 | 1 | 0 | 0 | 1 | 0 | 0 | 0 | 1 | 0 | |
| 0 | 1 | 0 | 1 | 0 | 0 | 0 | 0 | 1 | 0 | |
| 0 | 1 | 0 | 1 | 1 | 0 | 0 | 0 | 1 | 0 | |
| 0 | 1 | 1 | 0 | 0 | 0 | 0 | 1 | 0 | 0 | |
| — | — | — | — | — | — | — | — | — | — | T3 |
| 1 | 0 | 0 | 0 | 1 | 0 | 0 | 1 | 0 | 0 | |
| 1 | 0 | 0 | 1 | 0 | 0 | 1 | 0 | 0 | 0 | |
| — | — | — | — | — | — | — | — | — | — | T4 |
| 1 | 0 | 1 | 1 | 1 | 0 | 1 | 0 | 0 | 0 | |
| 1 | 1 | 0 | 0 | 0 | 1 | 0 | 0 | 0 | 0 | |
| — | — | — | — | — | — | — | — | — | — | T5 |
| 1 | 1 | 1 | 0 | 1 | 1 | 0 | 0 | 0 | 0 | |
| 1 | 1 | 1 | 1 | 0 | 0 | 0 | 0 | 0 | 0 | |
| 1 | 1 | 1 | 1 | 1 | 0 | 0 | 0 | 0 | 0 | |

TABLE C

| | | | | SEQ A PROM 28 | | | | |
|---|---|---|---|---|---|---|---|---|
| $A_4$ | $A_3$ | $A_2$ | $A_1$ | $A_0$ | $Q_2$ | $Q_1$ | $Q_0$ | |
| 0 | 0 | 0 | 0 | 0 | 0 | 0 | 1 | |
| 0 | 0 | 0 | 0 | 1 | 0 | 0 | 1 | |
| — | — | — | — | — | — | — | — | A1 |
| 0 | 1 | 0 | 0 | 0 | 0 | 0 | 1 | |
| 0 | 1 | 0 | 0 | 1 | 0 | 0 | 1 | |
| 0 | 1 | 0 | 1 | 0 | 0 | 1 | 0 | |
| 0 | 1 | 0 | 1 | 1 | 0 | 1 | 0 | |
| — | — | — | — | — | — | — | — | A2 |
| 1 | 0 | 1 | 0 | 0 | 0 | 1 | 0 | |
| 1 | 0 | 1 | 0 | 1 | 0 | 1 | 0 | |
| 1 | 0 | 1 | 1 | 0 | 1 | 0 | 0 | |
| 1 | 0 | 1 | 1 | 1 | 1 | 0 | 0 | |
| — | — | — | — | — | — | — | — | A3 |
| 1 | 1 | 1 | 1 | 0 | 1 | 0 | 0 | |
| 1 | 1 | 1 | 1 | 1 | 1 | 0 | 0 | | overlapping high level signals may be obtained by simply loading a 1 in the bit position desired. As an example, if it is required that MT PROM 26 have its wave forms $Q_0$ and $Q_1$ overlap, a 1 may be loaded in the least significant bit (LSB) position of the data word stored at memory address $6_8$ providing the overlap portion 50 of wave form $Q_0$ illustrated in phantom lines.

Figure 7A:
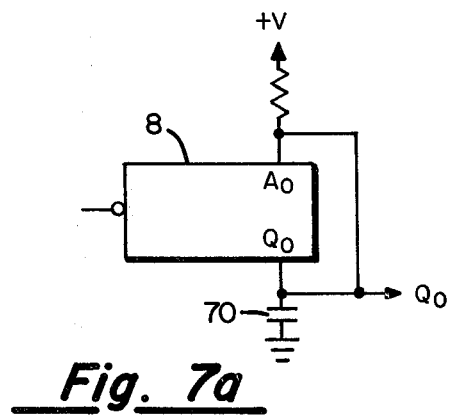
FIGS. 7a, 7b are illustrations of methods of varying the frequency of the OSC PROM of FIG. 1.
Figure 7B:
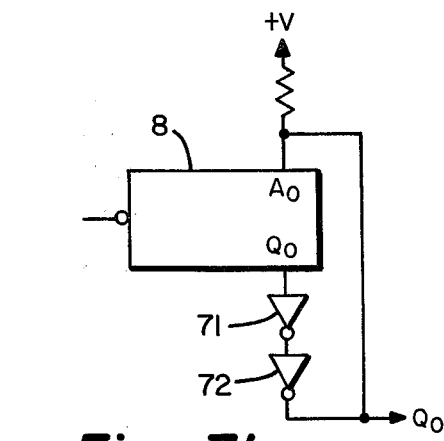

In the above discussion of the operation of OSC PROM 10 of FIG. 1, it was stated that the frequency of operation thereof was determined by the delay provided by the internal circuitry which is normally a fixed value predetermined by the manufacturer thereof. If it is desirable that such frequency of operation be altered to a lower frequency, the circuits of FIGS. 7a, 7b may be utilized. In FIG. 7a an external capacitor 70 is coupled intermediate the output terminal $Q_0$ and a voltage source such as ground potential while in FIG. 7b two inverter amplifiers 70, 71 are serially coupled intermediate the output terminal $Q_0$ and the associated input terminal $A_0$. In either application, the delay of the externally coupled devices is selected to achieve the desired effect upon the frequency of operation that would otherwise be determined solely by the delay of the internal electronics of PROM 8.

Figure 8:
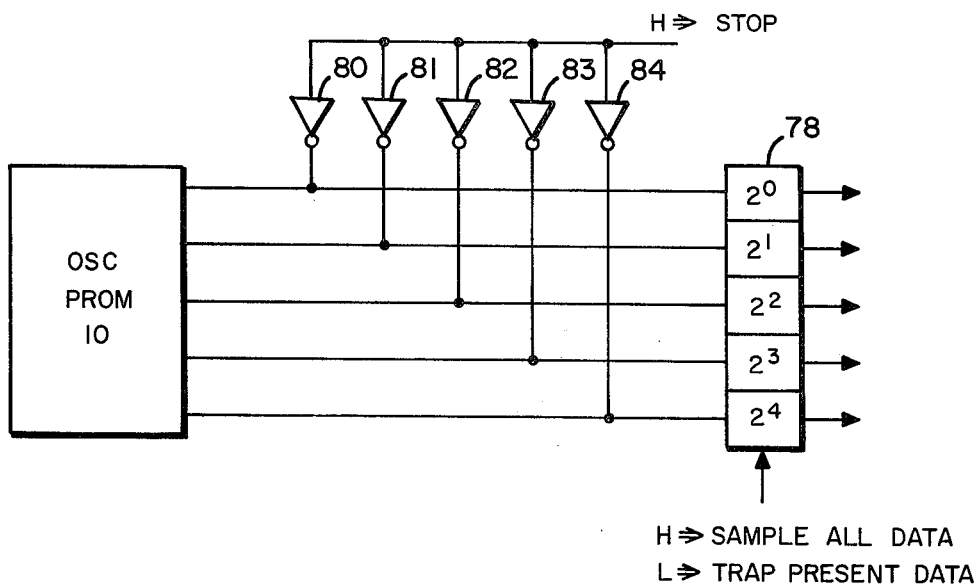
FIG. 8 is a circuit schematic illustrating the manner in which the circuit of FIG. 1 may be utilized with an additional MSI package to function as a counter.

With particular reference to FIG. 8 there is presented a schematic diagram illustrating the manner in which OSC PROM 10 of FIG. 1 may be utilized to function as a counter. In this configuration the output terminals $Q_0$–$Q_4$ are coupled directly to the respectively associated stages $2^0$–$2^4$ of a register constructed of R–S flip-flops. Also provided are a plurality of inverting amplifiers 80–84 coupled to the respectively associated output terminals $Q_0$–$Q_4$ to control the counting sequence as it affects register 78.

What is claimed is:

1. A signal generator, comprising:
   an addressable memory having n separate input terminals for receiving the n-bits of an n-bit address word to address one of the $2^n$ addressable registers therein each register storing an n-bit data word, the n bits of which are each coupled to a separate associated one of $n$ separate output terminals;
   a plurality of n-bit data words of differing values, said data words stored in consecutively addressed ones of said registers;
   n separate feedback means for directly coupling each separate one of said n output terminals back to only a separate associated one of said n input terminals;
   means enabling said memory to read out the data word stored in a first one of its registers for continuously and repetitively cycling said memory through its $2^n$ registers by using the read out data word as the address word to address the next addressed register at the next memory cycle;
   n separate output signal means coupled to each separate one of said n separate output terminals for generating, on each separate one of said n output signal means, n timing pulses of n differing frequencies.

2. The signal generator of claim 1 in which said n separate feedback means do not directly couple each separate one of said n output terminals to the separate associated one of said n input terminals, but each of said n separate feedback means includes similar delay means for decreasing the frequency of said memory cycle.

3. The signal generator of claim 1 in which each of said n separate feedback means includes delay means for decreasing the frequency of said memory cycle.

4. The signal generator of claim 1 further including:
   a register having $n$ states;

$n$ separate conductors coupled to each separate one of said $n$ separate output signal means for coupling each separate one of said n timing pulses to a separate associated one of the stages of said register.

5. A signal generator, comprising:

an addressable memory having n separate input terminals for receiving the n-bits of an n-bit address word to address one of the $2^n$ addressable registers therein, each register storing an n-bit data word, the n bits of which are each coupled to a separate associated one of n separate output terminals;

a binary table of $2^n$ n-bit data words of consecutively increasing values, said data words stored in consecutively addressed ones of said registers with a 1 stored in register address 0 and with a 0 stored in register address $2^n-1$;

$n$ separate feedback means for directly coupling each separate one of said n output terminals back to only a separate associated one of said n input terminals;

means enabling said memory to read out the data word stored in a first one of its registers for continuously and repetitively cycling said memory through its $2^n$ registers by using the read out data word as the address word to address the next addressed register at the next memory cycle, the frequency of said memory cycle being determined solely by the delay of the internal electronics of said memory;

$n$ separate output signal means coupled to each separate one of said $n$ separate output terminals for generating, on each separate one of said n output signal means, $n$ timing pulses of $n$ different frequencies.

* * * * *